United States Patent [19]
Win et al.

[11] Patent Number: 5,003,203
[45] Date of Patent: Mar. 26, 1991

[54] ADAPTIVE REFERENCE VOLTAGE GENERATION CIRCUIT FOR PLA SENSE AMPLIFIERS

[75] Inventors: Vincent K. Z. Win, Milpitas; Andrew K. Chan, Palo Alto, both of Calif.

[73] Assignee: Advanced Micro Devices, Inc., Sunnyvale, Calif.

[21] Appl. No.: 364,115

[22] Filed: Jun. 12, 1989

[51] Int. Cl.$^5$ .................... H03K 19/77; G06F 11/26; G11C 7/00; G11C 29/00

[52] U.S. Cl. .................................. 307/465; 365/201; 365/185; 364/716; 307/468; 307/296.6

[58] Field of Search ............... 307/465, 468, 469, 530, 307/296.6; 364/716, 784, 737; 340/825.83–825.91; 365/201, 185, 189.08

[56] References Cited

U.S. PATENT DOCUMENTS

| | | |
|---|---|---|
| 4,745,579 | 5/1988 | Mead et al. ...................... 307/465 X |
| 4,766,569 | 8/1988 | Turner et al. ................... 307/468 X |
| 4,855,954 | 8/1989 | Turner et al. ...................... 365/185 |
| 4,879,688 | 11/1989 | Turner et al. ..................... 365/185 X |
| 4,896,296 | 1/1990 | Turner et al. .................... 307/465 X |

Primary Examiner—Stanley D. Miller
Assistant Examiner—David R. Bertelson
Attorney, Agent, or Firm—William J. Benman, Jr.

[57] ABSTRACT

An adaptive reference voltage generation circuit. The invention generates a reference voltage for a sense amplifier to provide bias voltages for cells in a PAL type programmable logic array. The circuit of the invention includes a reference cell having characteristics substantially similar to the cells of the array. A reference voltage supply circuit is included for providing a reference voltage in response to any changes in the characteristics of the reference cell. In accordance with the method of the invention, the reference cell is programmed and erased whenever the cells in the array are programmed and erased. Thus the characteristics of the reference cell change in accordance with changes in the characteristics of the cells of the array. As the reference voltage of the circuit of the present invention changes inversely with changes in the characteristics of the reference cell, the circuit of the invention effectively compensates for changes in the characteristics of the cells in the array due to program and erase cycling thereof.

13 Claims, 3 Drawing Sheets

ADAPTIVE REFERENCE VOLTAGE GENERATION CIRCUIT FOR PLA SENSE AMPLIFIERS

BACKGROUND OF THE INVENTION

1. Field of the Invention

The present invention relates to programmable logic arrays (PLAs). More specifically, the present invention relates to sense amplifiers used in programmable array logic (PAL) circuits.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

2. Description of the Related Art

Programmable logic arrays provide 'glue logic' for PC (printed circuit) boards. Glue logic is the logic required to interface two boards and generally includes a plurality of AND gates, OR gates and input/output I/O buffers. PLAs consume less space and therefore generally provide glue logic in a less costly manner than individual AND gates, OR gates and I/O buffers.

PLAs also offer the advantage of reconfigurability over discrete or individual gates. That is, PLAs generally include an array of 'AND' gates, an array of 'OR' gates, and some provision for interconnecting the outputs of selected AND gates to the inputs of selected OR gates. PLAs allow a wide variety of logic functions to be implemented through the combination, via the OR gates, of the product terms, provided by the AND gates. Further, the configuration of the array may be quickly, easily and relatively inexpensively reprogrammed to implement other functions.

As described in U.S. Pat. No. 4,124,899, programmable array logic (PAL) circuits were developed to provide further improvements in the speed, space requirements, cost and power consumption of PLAs. PALs provide programmable AND and fixed OR functions. In a most general sense, a PAL provides a field programmable logic array in which a programmable array of circuit inputs are provided to a plurality of AND gates (cells) to generate product terms. Outputs from subgroups of AND gates are, in turn, nonprogrammably connected as inputs to individual, specified OR gates to provide the sum of products. Sense amplifiers detect state changes in the array and output product terms therefrom.

In many conventional sense amplifiers EE PALs, a fixed or constant reference voltage is used to bias the sense amplifier. The reference voltage is set as a design parameter and is based on the characteristics of the cells in the array. Unfortunately, the cells may be manufactured with characteristics that deviate from a desired specification. In addition, as the cells are programmed and erased repeatedly over time, the characteristics of the cell tend to change. The performance of PAL may therefore be less than optimal due to manufacturing process variations in cell characteristics or changes in cell characteristics due to program and erase cycling. While conventional sense amplifiers may compensate for the process and temperature variations, conventional sense amplifiers are not known to compensate for cycling variations in EE cell characteristics. Thus, there is a need in the art for a sense amplifier for EE PAL circuits which is capable of properly biasing the cells of the array notwithstanding changes in the characteristics of the cells over time.

SUMMARY OF THE INVENTION

The need in the art is addressed by the reference voltage generation circuit of the present invention. The invention generates a reference voltage for a sense amplifier in a PAL type programmable logic array. The circuit of the invention includes a reference cell having characteristics substantially similar to the cells of the array. A reference voltage supply circuit is included for providing a reference voltage in response to any changes in the characteristics of the reference cell.

In accordance with the method of the invention, the reference cell is programmed and erased whenever the cells in the array are programmed and erased. Thus the characteristics of the reference cell change in accordance with changes in the characteristics of the cells of the array. As the reference voltage of the circuit of the present invention changes inversely with changes in the characteristics of the reference cell, the circuit of the invention effectively compensates for changes in the characteristics of the cells in the array due to program and erase cycling thereof.

DESCRIPTION OF THE INVENTION

Figure 1:
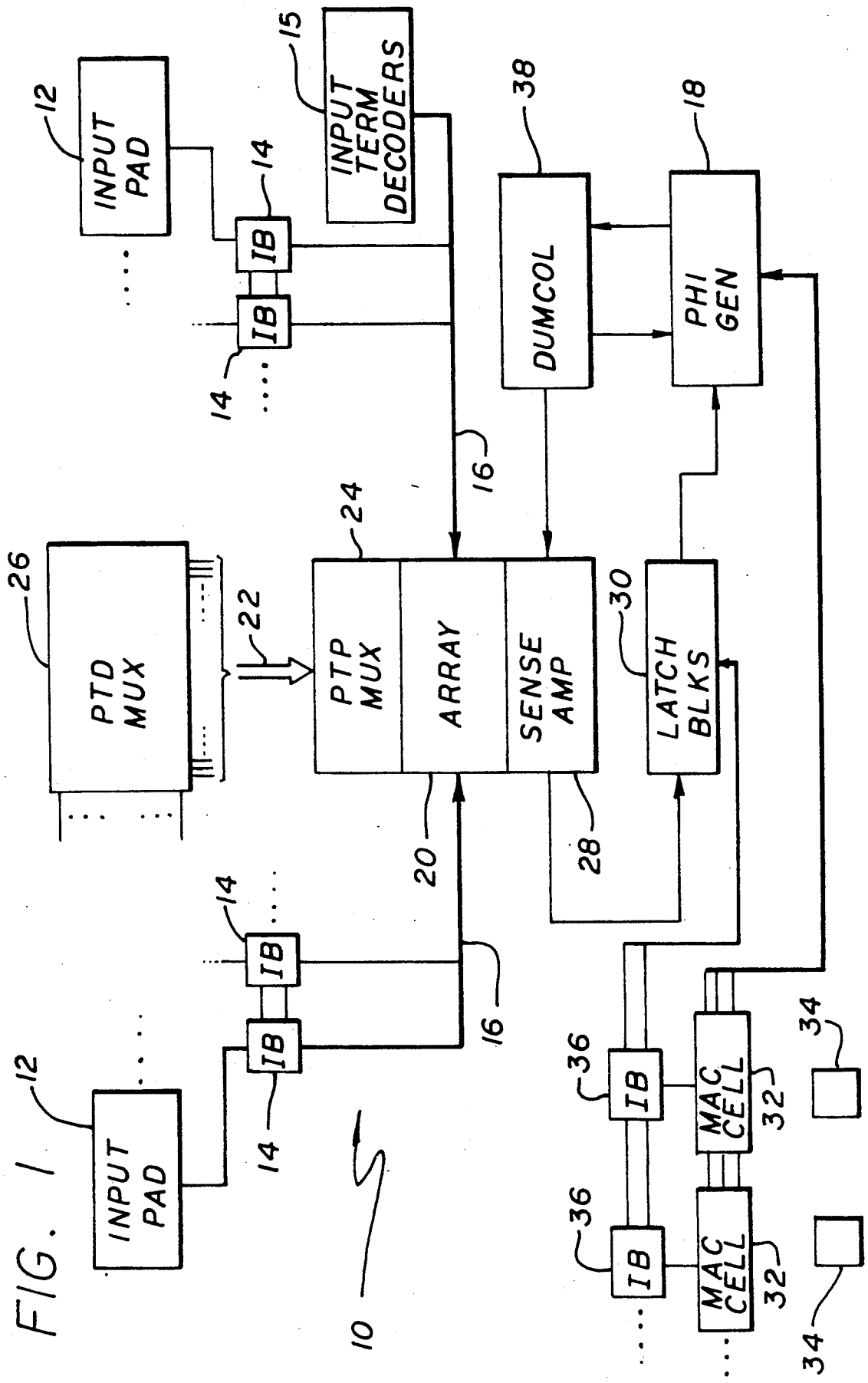
FIG. 1 is a simplified block diagram of an illustrative programmable array logic system.

FIG. 1 is a simplified block diagram of an illustrative programmable array logic (PAL) system 10. As is generally known in the art, the PAL 10 is a programmable logic array of a particularly advantageous design providing 'glue logic' for circuit interconnection at high speed with minimal power consumption. The PAL 10 includes a plurality of input pads 12 which are typically probe pads with electrostatic protection circuitry (not shown). The input pads 12 facilitate the bonding of a first circuit to another circuit via the 'glue logic' provided by the PAL 10. Each input pad 12 is connected to an input buffer (IB) 14. Each input buffer 14 includes circuitry for detecting address transitions at a corresponding input pad 12. Each input buffer 14 is connected to a bus 16 and a phi generator 18 called transition detect signal (TDS) bus (not shown). Input term decoders 15 are also connected to the bus 16. The bus 16 communicates with an array 20. The array 20 typically provides an electrically erasable ($E^2$) cell array of AND gates (not shown). As is known in the art, each input of each AND gate of the array 20 may be programmably interconnected to a selected line of an input data bus 16. A set of sense amplifiers 28 are connected to the array 20. The sense amplifiers 28 are connected to a plurality of latching circuits or latch blocks 30, one for each output of the array 20. The latch blocks 30 are each connected to a macrocell 32, each of which, in turn, may be connected to one or more of a plurality of output pads 34. The output pads 34 may double as input pads when data is propagated in a reverse direction through the PAL 10 via the input buffers 36.

In a normal (nonprogramming) mode of operation, the PAL 10 is in a standby mode consuming little or no power. When the input to an input pad 12 is switched, the input data terms propagate through the associated input buffer 14 to the array 20. The address transition detection logic in the input buffer 14 detects the address change at the associated input pad 12 and triggers the phi generator 18. When triggered, the phi generator 18 generates a pulse to the sense amplifiers 28 and the latch blocks 30 and the sense amplifiers 28 and the latch blocks 30 turn on from an initial standby state in which little or no power is consumed. At the same time, the phi generator 18 sends 'BLTCH' and 'LTCH' signals to the latch blocks 30. Input data from a buffer 14 is used by the array 20 to change the states of the product terms. The sense amplifiers 28 detect a state change in the array 20 and drive the latch blocks 30 with product terms therefrom. The 'BLTCH' and 'LTCH' signals from the phi generator 18 enable the latch blocks 30 so that when data is available from the sense amplifiers 28 it is detected and latched by the latch blocks 30 and used to drive the macrocells 32. The macrocells 32 provide register and other output functions (e.g. enable control, D flip-flop, set and reset control and other information and state control) to the associated output pad.

The timing of the latching function is critical to successful operation of the system 10. If the data is latched early, incorrect data may be output. If the data is latched late, incorrect data may be output or the device may operate at a slower than optimal speed. Accordingly, a dummy column 38 is provided which is essentially a capacitive load. The dummy column 38 is a delay circuit which models the propagation of data through the array 20 to the latch blocks 30. The dummy column 38 therefore provides proper timing for the phi generator 18.

Figure 2:
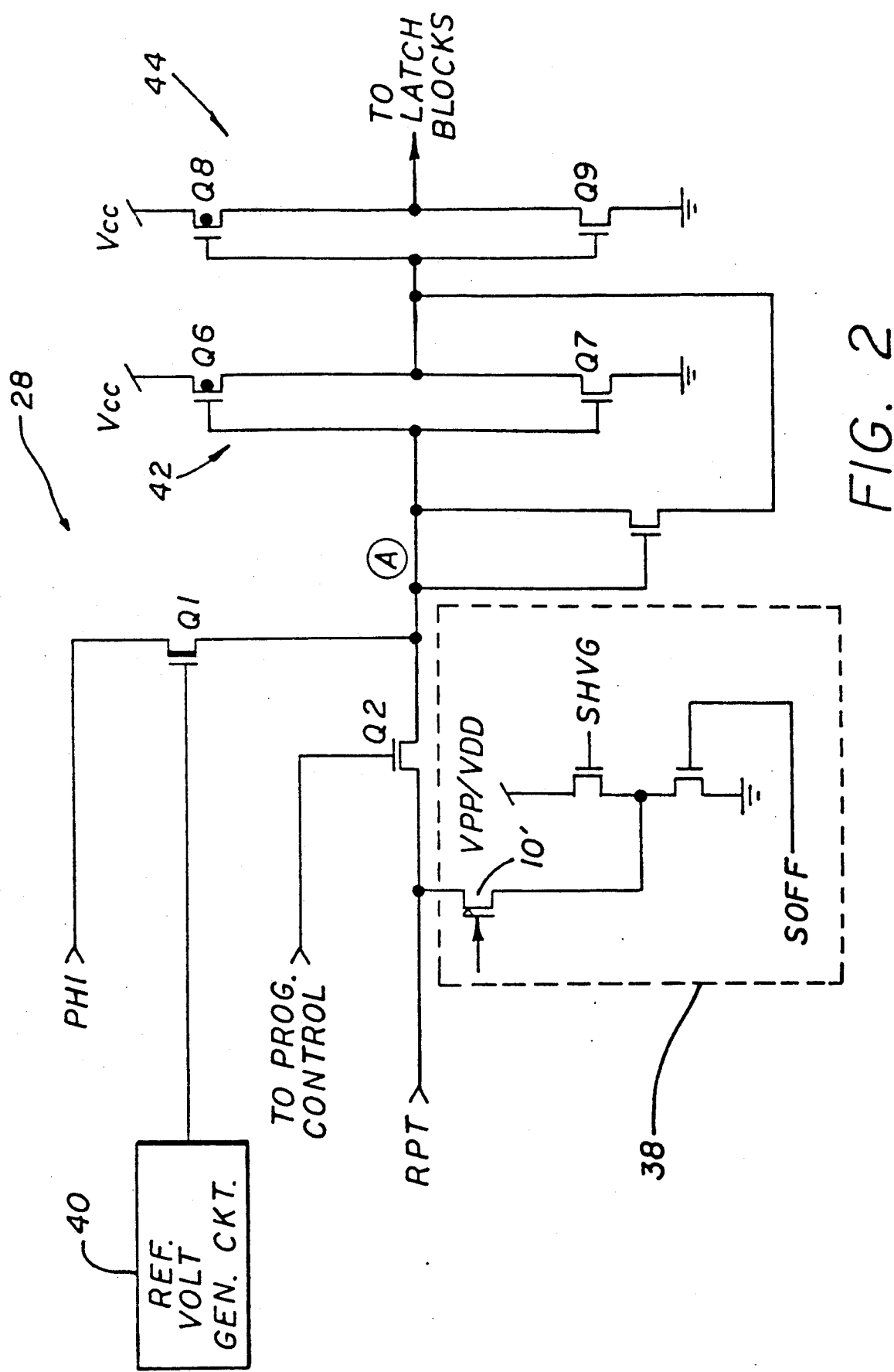
FIG. 2 is a simplified schematic diagram of an illustrative sense amplifier of the programmable array logic system of FIG. 1.

FIG. 2 is an illustrative embodiment of a sense amplifier 28 incorporating a reference voltage generation circuit of the present invention. The sense amplifier detects state changes in array 20. The sense amplifier 28 is implemented in CMOS (complementary metallic-oxide semiconductor) technology and includes a first n-channel depletion transistor Q1. The source terminal of the first transistor Q1 is connected to the phi generator 18. The gate terminal of the first transistor Q1 is connected to the reference voltage generation circuit 40 of the present invention. The drain of the first transistor Q1 is connected to the source terminal of a second n-channel transistor Q2 at a node A. The first transistor provides a pullup transistor for the voltage on node A, at a level which is determined by the reference potential on the gate thereof.

In conventional sense amplifiers, the reference potential is provided by a fixed source or a source with the capability of compensating only for process and temperature variations in the characteristics of the cells in the array 20. As mentioned above, such prior techniques for generating the reference voltage have therefore been unable to provide optimal voltage levels for arrays having cells whose operating characteristics have changed as a result of a number of program and erase cycles. In accordance with the present teachings, the reference potential is provided by the output of an adaptive reference voltage generation circuit.

Figure 3:
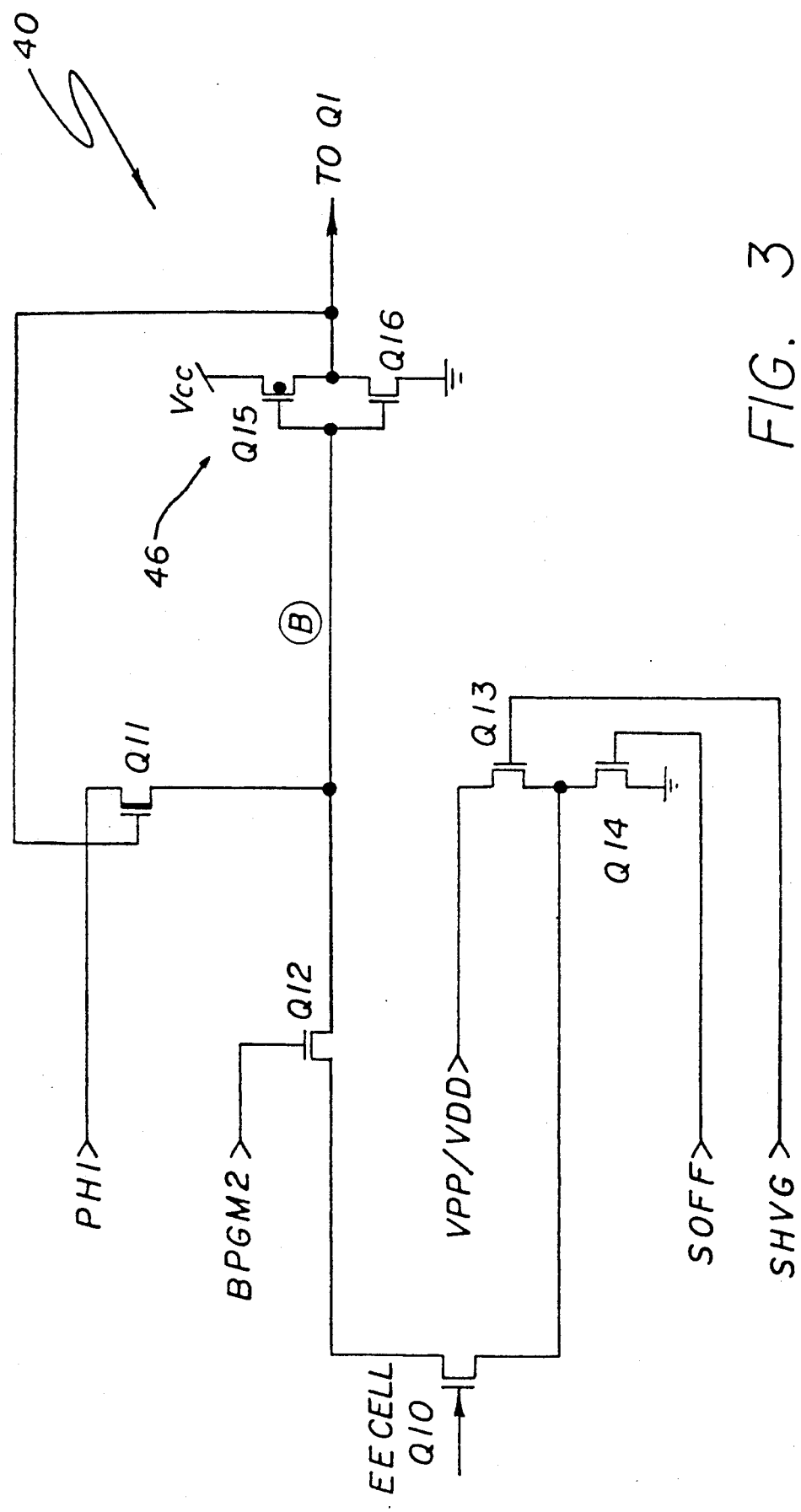
FIG. 3 is an illustrative schematic diagram of the reference voltage generation circuit of the present invention.

As shown in FIG. 3 and described in detail below, the reference voltage generation circuit 40 of the present invention incorporates a cell having essentially the same characteristics as the cells in the array. The cell in the reference voltage generation circuit 40 is programmed and/or erased wherever a corresponding cell in the array 20 is programmed and/or erased. Thus, the reference voltage generation circuit 40 of the present invention tracks changes in a corresponding cell in the array 20 and provides an optimal reference voltage in response thereto.

Returning to FIG. 2, the drain terminal of the second transistor Q2 is connected to an output terminal of a cell 38 of the array 20. As mentioned above, each cell 38 in the array 20 is typically an electrically erasable ($E^2$ or EE) cell providing an AND gate with programmable interconnections. A separate sense amplifier 28 is typically provided for each product term of the array 20. In FIG. 2, the cell of the array 20 is shown as a transistor Q10' having a source terminal connected to the drain of the second transistor Q2 of the sense amplifier 28, a gate terminal connected to an associated input buffer 14.

The gate of the second transistor Q2 is connected to the program control circuit (not shown) of the system 10. The second transistor Q2 provides for the selective enabling of the sense amplifier 28 and isolates the sense amplifier 28 from the high voltages typically used to program the cells 38 of the array 20.

A first p-channel transistor Q6 and a third n-channel transistor provide a first CMOS inverter 42. The inputs of the first p-channel transistor Q6 and the third n-channel transistor Q7 are tied to node A. The source terminal of the first p-channel transistor Q6 is connected to a source of supply and the drain of the first p-channel transistor Q6 is connected to the drain terminal of the third n-channel transistor Q7. The source of the third n-channel transistor Q7 is connected to ground. The output of the first inverter 42 is provided at the connection between the drain of the first p-channel transistor Q6 and the drain of the third n-channel transistor Q7.

A fourth n-channel transistor Q5 is connected as a diode in a feedforward configuration around the first inverter 42. That is, the gate and drain terminals of the fourth transistor Q5 are connected to the input terminal of the first inverter 42 and the source terminal is connected to the output of the first inverter 42. A second CMOS inverter 44 is connected in cascade the first inverter 42. The second inverter 44 is provided by a CMOS pair of transistors: a second p-channel transistor Q8 and a fifth n-channel transistor Q9. The second inverter is connected in the same configuration as the first inverter 42. The output of the second inverter 44 is the output of the sense amplifier 28 and is connected to the latch blocks 30 of the system 10.

FIG. 3 is an illustrative schematic diagram of the reference voltage generation circuit 40 of the present invention. A particularly novel aspect of the circuit 40 is that it includes an EE cell Q10 having essentially the same characteristics as the EE cell Q10' of the array 20. The gate terminal of the EE cell Q10 is connected to Vcc or source supply in normal mode and a programming circuit during programing mode. The source terminal of the EE cell Q10 is connected to the drain terminal of a sixth n-channel transistor Q12. The sixth n-channel transistor Q12 performs essentially in the same manner and for the same purpose as the second n-channel transistor Q2 of the sense amplifier 28.

The drain terminal of the EE cell Q10 is connected to a node between the source terminal of a seventh n-channel transistor Q13 and the drain terminal of an eighth n-channel transistor Q14. The drain terminal of the seventh n-channel transistor Q13 is connected to the programming circuit through bus Vpp/VDD. The source terminal of the eighth n-channel transistor Q14 is connected to ground. The gate terminal of the seventh and n-channel transistor Q13 is connected to a source of a programming control signal SOFF (source off) (not shown) and the gate terminal of the eighth n-channel transistor Q14 is connected to a source of programming control signal SHVG (source high voltage) (not shown).

In the programming mode of operation, the sixth and the eighth n-channel transistors Q12 and Q14 are off and the seventh n-channel transistor Q13 is on. The EE cell Q10 is therefore isolated from the other components in the circuit 40 while a high programming voltage is provided thereto, via the seventh n-channel transistor Q13, at the drain of transistor Q10 and at the gate of transistor Q10 (via programming circuits).

The source terminal of the sixth n-channel transistor Q12 is connected to the input terminal of a third CMOS inverter 46 provided by a third p-channel transistor Q15 and a ninth n-channel transistor Q16. The source terminal of the third p-channel transistor Q15 is connected to a source of supply voltage $V_{cc}$, the drain terminal of the third p-channel transistor Q15 is connected to the drain terminal of the ninth n-channel transistor Q16 and the source terminal of the ninth n-channel transistor Q16 is connected to ground. The gates of the third p-channel transistor Q15 and the ninth n-channel transistor Q16 are connected to provide a common input at a node B. The output of the inverter 46 is provided at the junction of the drain terminal of the third p-channel transistor Q15 and the drain terminal of the ninth n-channel transistor Q16.

The output of the inverter is input to the gate of the first transistor Q1 and fed back to the input through the gate to drain junction of a tenth n-channel depletion mode transistor Q11. The source of the tenth n-channel depletion mode transistor Q11 is connected to the phi generator 18.

The cell Q10 in the reference voltage generation circuit 40 is programmed and/or erased wherever a corresponding cell in the array 20 is programmed and/or erased. Over time, this cycling of the cell Q10 in the circuit 40 will have essentially the same effect as the cycling of the cells Q10' in the array 20. If, for example, the cycling has the effect of decreasing the source-to-drain resistance of the cells Q10' in the array 20, then the source-to-drain resistance of the cell Q10 will decrease accordingly. In this case, the cell Q10' of the sense amplifier 28 of FIG. 2 will tend to draw more current through the second n-channel transistor Q2 and pull node A down. Ordinarily, the result would be a lower voltage to the latch blocks 30 and hence slower low to high propagation time. However, in accordance with the present invention and as illustrated in FIG. 3, the cell Q10 of the circuit 40 will also draw more current (through the sixth n-channel transistor Q12) and tend to pull node B down. The output of the third inverter 46 will respond by going up with the result that a higher reference voltage will be supplied to the gate of the pullup transistor Q1 of the sense amplifier 28. See FIG. 2. The higher reference voltage on the gate terminal of the pullup transistor Q1 will cause Q1 to conduct more current to node A pulling node A up. This will tend to stabilize the node and propagation time in spite of changes in the characteristics of the cell Q10' in the array. It will be clear, then, to those skilled in the art that the reference voltage generation circuit 40 of the present invention tracks changes in a corresponding cell in the array 20 and provides an optimal reference voltage in response thereto.

Table I below provides illustrative widths and lengths, in microns, of each of the circuit elements for a preferred embodiment of the invention.

TABLE I

| ELEMENT | WIDTH | LENGTH |
|---------|-------|--------|
| Q1 | 7 | 2.3 |
| Q2 | 20.204 | 3 |
| Q3 | 11 | 3 |
| Q4 | 6 | 3 |
| Q5 | 6 | 1.8 |
| Q6 | 15 | 2 |
| Q7 | 15 | 1.8 |
| Q8 | 15 | 2 |
| Q9 | 15 | 1.8 |
| Q11 | 12 | 2.3 |
| Q12 | 20.204 | 3 |
| Q13 | 11 | 3 |
| Q14 | 6 | 3 |
| Q15 | 30 | 2 |
| Q16 | 30 | 1.8 |

Thus a method has been described for biasing the cells of a programmable logic array including the steps of:

(a) providing an adaptive reference voltage generation circuit including a reference cell having characteristics substantially similar to the cells of the array and reference voltage supply subcircuit for providing a reference voltage in response to any change in the characteristics of said reference cell;

(b) programming the reference cell before programming the cells of the array and/or (c) erasing the reference cell before erasing the cells of the array, whereby the reference voltage output by the voltage reference circuit changes inversely with changes in the characteristics of the reference cell such that the reference voltage circuit effectively compensates for changes in the characteristics of the cells in the array due to program and erase cycling thereof and process variations therein.

Thus, the present invention has been described herein with reference to a particular embodiment for a particular application. Those having ordinary skill in the art and access to the present teachings will recognize additional modifications applications and embodiments within the scope thereof. For example, the invention is not limited to implementation in either positive or negative logic. Nor is the invention limited to the use of field effect transistors. Any suitable switching element may be used in place of the transistors in the illustrative embodiments without departing from the scope of the present teachings.

It is therefore intended by the appended claims to cover any and all such applications, modifications and embodiments within the scope of the present invention.

Accordingly,

What is claimed is:

1. An adaptive reference voltage generation circuit for generating a reference voltage for a sense amplifier to provide a bias voltage for a cell in a programmable array logic array of cells, said reference voltage generation circuit including:
- a reference cell having characteristics substantially similar to the characteristics of said cell of said array and
- reference voltage supply means for providing a reference voltage to said sense amplifier based on response to any change the characteristics of said reference cell.

2. The invention of claim 1 wherein said reference cell includes a first field effect transistor having an input terminal and first and second terminals.

3. The invention of claim 2 wherein said reference voltage supply means includes an inverter with an input terminal connected to the first terminal of said transistor and an output terminal providing the output terminal of said reference voltage generation circuit.

4. The invention of claim 3 including means for feeding the output of said inverter back to the input thereof.

5. The invention of claim 4 wherein feedback means includes a second field effect transistor having an input terminal connected to output of said inverter, a first terminal connected to input of said inverter and a second terminal connected to a source of supply voltage.

6. The invention of claim 5 including isolation means for isolating said inverter during a programming mode of operation.

7. The invention of claim 6 wherein said isolation means includes first means for connecting the second terminal of said reference cell to a source of supply.

8. The invention of claim 7 wherein said isolation means includes means for disconnecting the first terminal of said reference cell from the input terminal of said inverter.

9. The invention of claim 8 wherein said sense amplifier includes a pullup transistor and the output of said inverter is connected to an input terminal of said pullup transistor.

10. A method for biasing the cells of a programmable logic array including the steps of:
   (a) providing an adaptive reference voltage generation circuit including a reference cell having characteristics substantially similar to the cells of said array and reference voltage supply means for providing a reference voltage in response to any change in the characteristics of said reference cell;
   (b) programming the reference cell before programming the cells of the array and/or
   (c) erasing the reference cell before erasing the cells of the array,
   whereby the reference voltage output by the voltage reference circuit changes inversely with changes in the characteristics of the reference cell such that the reference voltage circuit effectively compensates for changes in the characteristics of the cells in the array due to program and erase cycling thereof.

11. An adaptive reference voltage generation circuit for generating a reference voltage for a sense amplifier to provide a bias voltage for a cell in a programmable array logic array of cells, said reference voltage generation circuit including:
- a reference cell having characteristics substantially similar to the characteristics of said cell of said array and coupled to be programmed or erased whenever said cell of said array is programmed or erased, respectively, and
- reference voltage supply means for providing a reference voltage to said sense amplifier based on the characteristics of said reference cell.

12. An adaptive reference voltage generation circuit for generating a reference voltage for a sense amplifier to provide a bias voltage for a cell in a programmable array logic array of cells, said reference voltage generation circuit including:
- a reference cell having characteristics substantially similar to the characteristics of said cell of said array, said cell including a first field effect transistor having an input terminal and first and second terminals;
- first means for connecting said second terminal to a source of a first potential during a first mode of operation;
- second means for connecting said second terminal to a source of a second potential during a second mode of operation; and
- reference voltage supply means for providing a reference voltage to said sense amplifier based on the characteristics of said reference cell during said second mode of operation, said reference voltage supply means including an inverter with an input terminal connected to the first terminal of said transistor and an output terminal providing the output terminal of said reference voltage generation circuit.

13. The invention of claim 7 wherein said isolation means includes second means for connecting the second terminal of said reference cell to ground potential.

* * * * *

REEXAMINATION CERTIFICATE (1866th)
United States Patent [19]
Win et al.

[11] B1 5,003,203
[45] Certificate Issued    Dec. 1, 1992

[54] ADAPTIVE REFERENCE VOLTAGE GENERATION CIRCUIT FOR PLA SENSE AMPLIFIERS

[75] Inventors: Vincent K. Z. Win, Milpitas; Andrew K. Chan, Palo Alto, both of Calif.

[73] Assignee: Advanced Micro Devices, Inc., Sunnyvale, Calif.

Reexamination Request:
No. 90/002,573, Feb. 19, 1992

Reexamination Certificate for:
Patent No.: 5,003,203
Issued: Mar. 26, 1991
Appl. No.: 364,115
Filed: Jun. 12, 1989

[51] Int. Cl.[5] .................. H03K 19/003; H03K 19/094
[52] U.S. Cl. .................... 307/465; 307/468; 307/296.6; 365/201; 365/185; 365/189.07; 365/189.09; 364/716
[58] Field of Search ............ 307/465, 468, 475, 296.1, 307/296.5, 296.6, 296.8, 491, 497, 530; 365/189.07, 189.08, 189.09

[56] References Cited
U.S. PATENT DOCUMENTS
4,903,237  2/1990  Rao .................................... 365/185

FOREIGN PATENT DOCUMENTS
2089612  12/1981  United Kingdom ................ 307/530

Primary Examiner—John S. Heyman

[57] ABSTRACT

An adaptive reference voltage generation circuit. The invention generates a reference voltage for a sense amplifier to provide bias voltages for cells in a PAL type programmable logic array. The circuit of the invention includes a reference cell having characteristics substantially similar to the cells of the array. A reference voltage supply circuit is included for providing a reference voltage in response to any changes in the characteristics of the reference cell. In accordance with the method of the invention, the reference cell is programmed and erased whenever the cells in the array are programmed and erased. Thus the characteristics of the reference cell change in accordance with changes in the characteristics of the cells of the array. As the reference voltage of the circuit of the present invention changes inversely with changes in the characteristics of the reference cell, the circuit of the invention effectively compensates for changes in the characteristics of the cells in the array due to program and erase cycling thereof.

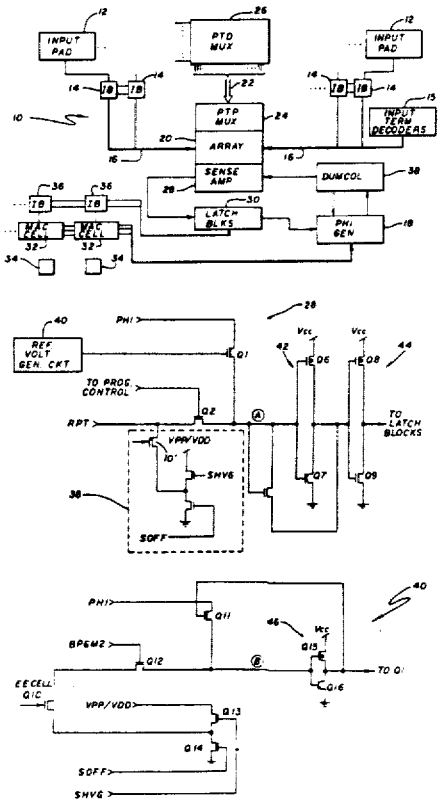

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

ONLY THOSE PARAGRAPHS OF THE SPECIFICATION AFFECTED BY AMENDMENT ARE PRINTED HEREIN.

Column 5 lines 1–14.

The drain terminal of the EE cell Q10 is connected to a node between the [source] *drain* terminal of a seventh n-channel transistor Q13 and the [drain] *source* terminal of an eighth n-channel transistor Q14. The [drain] *source* terminal of the seventh n-channel transistor Q13 is connected to the programming circuit through bus Vpp/VDD. The [source] *drain* terminal of the eighth n-channel transistor Q14 is connected to ground. The gate terminal of the seventh [and] n-channel transistor Q13 is connected to a source of a programming control signal [SOFF (Source off)] *SHVG (Source high voltage)* (not shown) and the gate terminal of the eighth n-channel transistor Q14 is connected to a source of programming control signal [SHVG (source high voltage)] *SOFF (source off)* (not shown).

AS A RESULT OF REEXAMINATION, IT HAS BEEN DETERMINED THAT:

The patentability of claims 10 and 12 is confirmed.

Claim 11 is cancelled.

Claim 1 is determined to be patentable as amended.

Claims 2–9 and 13, dependent on an amended claim, are determined to be patentable.

1. An adaptive reference voltage generation circuit for generating a reference voltage for a sense amplifier to provide a bias voltage for a cell in a programmable array logic array of cells, said reference voltage generation circuit including:
   a reference cell having characteristics substantially similar to the characteristics of said cell of said array *and connected to be programmed or erased whenever said cell of said array is programmed or erased, respectively*, and
   reference voltage supply means for providing a reference voltage to said sense amplifier based on [response to any change] *the characteristics* of said reference cell.

* * * * *